US00RE47503E

(19) United States
(12) Reissued Patent
Dyer et al.

(10) Patent Number: US RE47,503 E
(45) Date of Reissued Patent: Jul. 9, 2019

(54) PHOTODETECTORS USEFUL AS AMBIENT LIGHT SENSORS AND METHODS FOR USE IN MANUFACTURING THE SAME

(71) Applicant: INTERSIL AMERICAS LLC, Milpitas, CA (US)

(72) Inventors: Kenneth Dyer, Pleasanton, CA (US); Eric Lee, San Francisco, CA (US); Xijian Lin, Fremont, CA (US)

(73) Assignee: INTERSIL AMERICAS LLC, Milpitas, CA (US)

(21) Appl. No.: 15/078,995

(22) Filed: Mar. 23, 2016

Related U.S. Patent Documents

Reissue of:
(64) Patent No.: 8,779,542
Issued: Jul. 15, 2014
Appl. No.: 13/717,080
Filed: Dec. 17, 2012

U.S. Applications:
(60) Provisional application No. 61/729,239, filed on Nov. 21, 2012.

(51) Int. Cl.
*H01L 31/0203* (2014.01)
*H01L 27/146* (2006.01)
(Continued)

(52) U.S. Cl.
CPC .. *H01L 27/14625* (2013.01); *H01L 27/14629* (2013.01); *H01L 31/0232* (2013.01); *H01L 31/02162* (2013.01); *H01L 31/02164* (2013.01)

(58) Field of Classification Search
CPC ..... H01L 27/14625; H01L 27/14629; H01L 31/02164; H01L 31/02162; H01L 31/0232
See application file for complete search history.

(56) References Cited

U.S. PATENT DOCUMENTS 4,096,512 A 6/1978 Polinsky
4,913,846 A 4/1990 Suzuki et al.
(Continued)

FOREIGN PATENT DOCUMENTS

CN 101604700 A 12/2009
CN 102095495 A 6/2011
(Continued)

OTHER PUBLICATIONS

International Search Report for International Application No. PCT/US2008/051450 (dated May 20, 2008).
(Continued)

*Primary Examiner* — Ling X Xu
(74) *Attorney, Agent, or Firm* — Foley & Lardner LLP

(57) ABSTRACT

Photodetectors, methods for use in manufacturing photodetectors, and systems including photodetectors, are described herein. In an embodiment, a photodetector includes a plurality of photodiode regions, at least some of which are covered by an optical filter. A plurality of metal layers are located between the photodiode regions and the optical filter. The metal layers include an uppermost metal layer that is closest to the optical filter and a lowermost metal layer that is closest to the photodiode regions. One or more inter-level dielectric layers separate the metal layers from one another. Each of the metal layers includes one or more metal portions and one or more dielectric portions. The uppermost metal layer is devoid of any metal portions underlying the optical filter.

30 Claims, 12 Drawing Sheets

(51) Int. Cl.
*H01L 31/0216* (2014.01)
*H01L 31/0232* (2014.01)

(56) References Cited

U.S. PATENT DOCUMENTS

| | | | | |
|---|---|---|---|---|
| 4,937,450 | A | 6/1990 | Wakabayashi et al. | |
| 5,130,775 | A | 7/1992 | Maeda et al. | |
| 5,686,639 | A | 11/1997 | Cohen | |
| 5,753,375 | A | 5/1998 | Ray | |
| 5,801,373 | A | 9/1998 | Oozu et al. | |
| 6,157,035 | A | 12/2000 | Kuijk et al. | |
| 6,211,521 | B1 | 4/2001 | Bawolek et al. | |
| 6,218,719 | B1 | 4/2001 | Tsang | |
| 6,596,981 | B1 | 7/2003 | Aswell et al. | |
| 6,724,063 | B2 | 4/2004 | Kuhara et al. | |
| 6,743,652 | B2 | 6/2004 | Thomas et al. | |
| 6,825,470 | B1 | 11/2004 | Bawolek et al. | |
| 6,830,951 | B2 | 12/2004 | Laurin et al. | |
| 6,998,207 | B2 | 2/2006 | Yaung | |
| 7,163,832 | B2 | 1/2007 | Kim | |
| 7,297,916 | B1 | 11/2007 | Feng | |
| 7,394,059 | B2 | 7/2008 | Fukuyoshi et al. | |
| 7,485,486 | B2 | 2/2009 | Zheng et al. | |
| 8,045,033 | B2 | 10/2011 | Honda et al. | |
| 8,492,699 | B2 | 7/2013 | Zheng et al. | |
| 2002/0017612 | A1 | 2/2002 | Yu et al. | |
| 2002/0047174 | A1 | 4/2002 | De Pauw et al. | |
| 2004/0089790 | A1 | 5/2004 | Rubin et al. | |
| 2004/0184173 | A1 | 9/2004 | Kobayashi et al. | |
| 2005/0041292 | A1 | 2/2005 | Wheatley et al. | |
| 2005/0133690 | A1 | 6/2005 | Higashitsutsumi | |
| 2005/0133693 | A1 | 6/2005 | Fouquet et al. | |
| 2005/0186754 | A1 | 8/2005 | Kim | |
| 2005/0287479 | A1 | 12/2005 | Moon | |
| 2006/0049533 | A1 | 3/2006 | Kamoshita | |
| 2006/0147718 | A1 | 7/2006 | Starkey | |
| 2006/0199105 | A1 | 9/2006 | Cahill | |
| 2007/0238802 | A1 | 10/2007 | Harada et al. | |
| 2007/0273781 | A1 | 11/2007 | Choe et al. | |
| 2008/0135968 | A1 | 6/2008 | Kalnitsky et al. | |
| 2008/0191298 | A1 | 8/2008 | Lin et al. | |
| 2008/0237453 | A1 | 10/2008 | Chen et al. | |
| 2009/0130398 | A1 | 5/2009 | Irving et al. | |
| 2009/0236571 | A1 | 9/2009 | Cohen | |
| 2009/0315131 | A1 | 12/2009 | Hung et al. | |
| 2011/0068255 | A1* | 3/2011 | Zheng et al. | 250/208.2 |
| 2012/0187513 | A1 | 7/2012 | Holenarsipur et al. | |
| 2013/0209026 | A1* | 8/2013 | Doany et al. | 385/14 |

FOREIGN PATENT DOCUMENTS

| | | | |
|---|---|---|---|
| CN | 102623467 | A | 8/2012 |
| CN | CN 103839953 | A | 6/2014 |
| EP | 97870061.5 | | 4/1997 |
| EP | 0 875 939 | A1 | 4/1998 |
| EP | 0 877 426 | A1 | 11/1998 |
| EP | 1 073 125 | A2 | 1/2001 |
| JP | 2003-163344 | | 6/2003 |
| JP | 2004-047544 | | 2/2004 |
| TW | 200952166 | A | 12/2009 |
| TW | 201129784 | A | 9/2011 |
| TW | 201421654 | A | 6/2014 |
| WO | WO 99/50682 | | 10/1999 |
| WO | WO 2006/003807 | | 12/2006 |
| WO | WO 2008/097705 | | 8/2008 |

OTHER PUBLICATIONS

Windisch et al., "Large-Signal-Modulation of High-Efficiency Light-Emitting Diodes for Optical Communication"; IEEE Journal of Quantum Electronics, vol. 36, No. 12, Dec. 2000; pp. 1445-1453.
Bontems et al., "Synthesis and Properties of Monodisperse Polydimethylsiloxane Networks"; 907 Journal of Polymer Science Part A: Polymer Chemistry Edition 31(1993) October, No. 11, New York, US; pp. 2697-2710.
"Photodetector Elements," 3 pp., http://www.iee.et.tu-dresden.de/iee/eb/analog/papers/mirrow/visionchip . . . /photodetector.htm, printed Oct. 24, 2002.
Restriction dated Jan. 10, 2014, in U.S. Appl. No. 13/717,080, filed Dec. 17, 2012.
Amendment dated Jan. 27, 2014, in U.S. Appl. No. 13/717,080, filed Dec. 17, 2012.
Notice of Allowance dated Mar. 20, 2014, in U.S. Appl. No. 13/717,080, filed Dec. 17, 2012.
Amendment dated Apr. 14, 2014, in U.S. Appl. No. 13/717,080, filed Dec. 17, 2012.
Amendment dated Jul. 10, 2015, in Chinese Patent Appl. No. 201310449984.7 filed Sep. 27, 2013.
Amendment dated Aug. 13, 2014, in Taiwanese Patent Appl. No. 102133359 filed Sep. 14, 2013.
Office Action dated Oct. 26, 2015, in Taiwanese Patent Appl. No. 102133359 filed Sep. 14, 2013.
Amendment dated Dec. 15, 2015, in Taiwanese Patent Appl. No. 102133359 filed Sep. 14, 2013.
Notice of Allowance dated Dec. 30, 2015, in Taiwanese Patent Appl. No. 102133359 filed Sep. 14, 2013.
English translation of Search Report for Chinese Patent Application 201310449984.7, dated Apr. 19, 2017, 2 pages.
Office Action and Search Report for Chinese Patent Application 201310449984.7, dated Apr. 19, 2017, 11 pages.
Notice of Allowance dated Apr. 16, 2013, in U.S. Appl. No. 12/885,297, filed Sep. 17, 2010.
Amendment dated Jan. 25, 2013, in U.S. Appl. No. 12/885,297, filed Sep. 17, 2010.
Fukunaga, et al., "SI-OEIC (OPIC) for Optical Pickup," IEEE Transactions on Consumer Electronics, vol. 43, No. 2, May 1997, pp. 157-164.
Ghazi et al., "CMOS Photodiode with Enhanced Responsivity for the UV/Blue Spectral Range," IEEE Transactions on Electron Devices, vol. 49, No. 7, Jul. 2002, pp. 1124-1128.
Zimmerman et al., "Advanced Photo Integrated Circuits in CMOS Technology", 49th Electronic Components and Technology Conference, San Diego, Jun. 1-4, 1999, USA, pp. 1030-1035.
International Preliminary Report on Patentability for International Application No. PCT/US2008/051450, dated Apr. 30, 2009, 8 pages.
Lalanne, P. et al., "CMOS Photodiodes Based on Vertical p-n-p Junctions," 11th International Parallel Processing Symposium, Apr. 1-5, 1997, Published by IEEE, 8 pages.
W. Zhang et al., "Performance of a CMOS Compatible Lateral Bipolar Photodetector on SOI Substrate," IEEE Electron Device Letts. 19(11):435-437 (Nov. 1998).
M. Kuijk et al., "Spatially Modulated Light Detector in CMOS with Sense-Amplifier Receiver Operating at 180 Mb/s for Optical Data Link Applications and Parallel Optical Interconnects Between Chips," IEEE J. Selected Topics Quantum Electronics 4(6):1040-1045 (Nov. 1998).
T.K. Woodward et al., "1-Gb/s Integrated Optical Detectors and Receivers in Commercial CMOS Technologies," IEEE J. Selected Topics Quantum Electronics 5(2):146-158 (Mar. 1999).
C. Rooman et al., "Asynchronous 250-Mb/s Optical Receivers with Integrated Detector in Standard CMOS Technology for Optocoupler Applications," IEEE J. Solid-State Circuits 35(7):953-958 (Jul. 2000).
"APC Amplifier with Integrated Photodetector for 24X CD-R and CD-RW Applications," Sipex SP8020, Sipex Corporation, 7 pp. Mar. 9, 2001.
H. Zimmermann, ed., "Integrated Silicon Opto-electronics," Photonics pp. 4-6, 15-22, Springer, (May 2000).
Winkelmann et al., "DOE-2 Supplement", Version 2.1E, Lawrence Berkeley Laboratory, Berkeley, CA. 94720; pp. 1.1 to 1.9., Dec. 1993.
U.S. Appl. No. 12/885,297, filed Sep. 17, 2010.
Office Action dated Jan. 2, 2013, in U.S. Appl. No. 12/885,297, filed Sep. 17, 2010.

(56) References Cited

OTHER PUBLICATIONS

Preliminary Amendment dated Oct. 19, 2010, in U.S. Appl. No. 12/885,297, filed Sep. 17, 2010.

* cited by examiner

PHOTODETECTORS USEFUL AS AMBIENT LIGHT SENSORS AND METHODS FOR USE IN MANUFACTURING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

PRIORITY CLAIM

This application claims priority to U.S. Provisional Patent Application No. 61/729,239, filed Nov. 21, 2012, which is incorporated herein by reference.

RELATED APPLICATION

This application is related to U.S. patent application Ser. No. 12/885,297, entitled PHOTODETECTORS USEFUL AS AMBIENT LIGHT SENSORS, filed Sep. 17, 2010, which is incorporated herein by reference.

BACKGROUND

Photodetectors can be used as ambient light sensors (ALSs), e.g., for use as energy saving light sensors for displays, for controlling backlighting in portable devices such as mobile phones and laptop computers, and for various other types of light level measurement and management. For more specific examples, ambient light sensors can be used to reduce overall display-system power consumption and to increase Liquid Crystal Display (LCD) lifespan by detecting bright and dim ambient light conditions as a means of controlling display and/or keypad backlighting. Without ambient light sensors, LCD display backlighting control is typically done manually whereby users will increase the intensity of the LCD as the ambient environment becomes brighter. With the use of ambient light sensors, users can adjust the LCD brightness to their preference, and as the ambient environment changes, the display brightness adjusts to make the display appear uniform at the same perceived level; this results in battery life being extended, user eye strain being reduced, and LCD lifespan being extended. Similarly, without ambient light sensors, control of the keypad backlight is very much dependent on the user and software. For example, keypad backlight can be turned on for 10 second by a trigger which can be triggered by pressing the keypad, or a timer. With the use of ambient light sensors, keypad backlighting can be turned on only when the ambient environment is dim, which will result in longer battery life. In order to achieve better ambient light sensing, ambient light sensors preferably have a spectral response close to the human eye response and have excellent infrared (IR) noise suppression.

DETAILED DESCRIPTION

Figure 1:
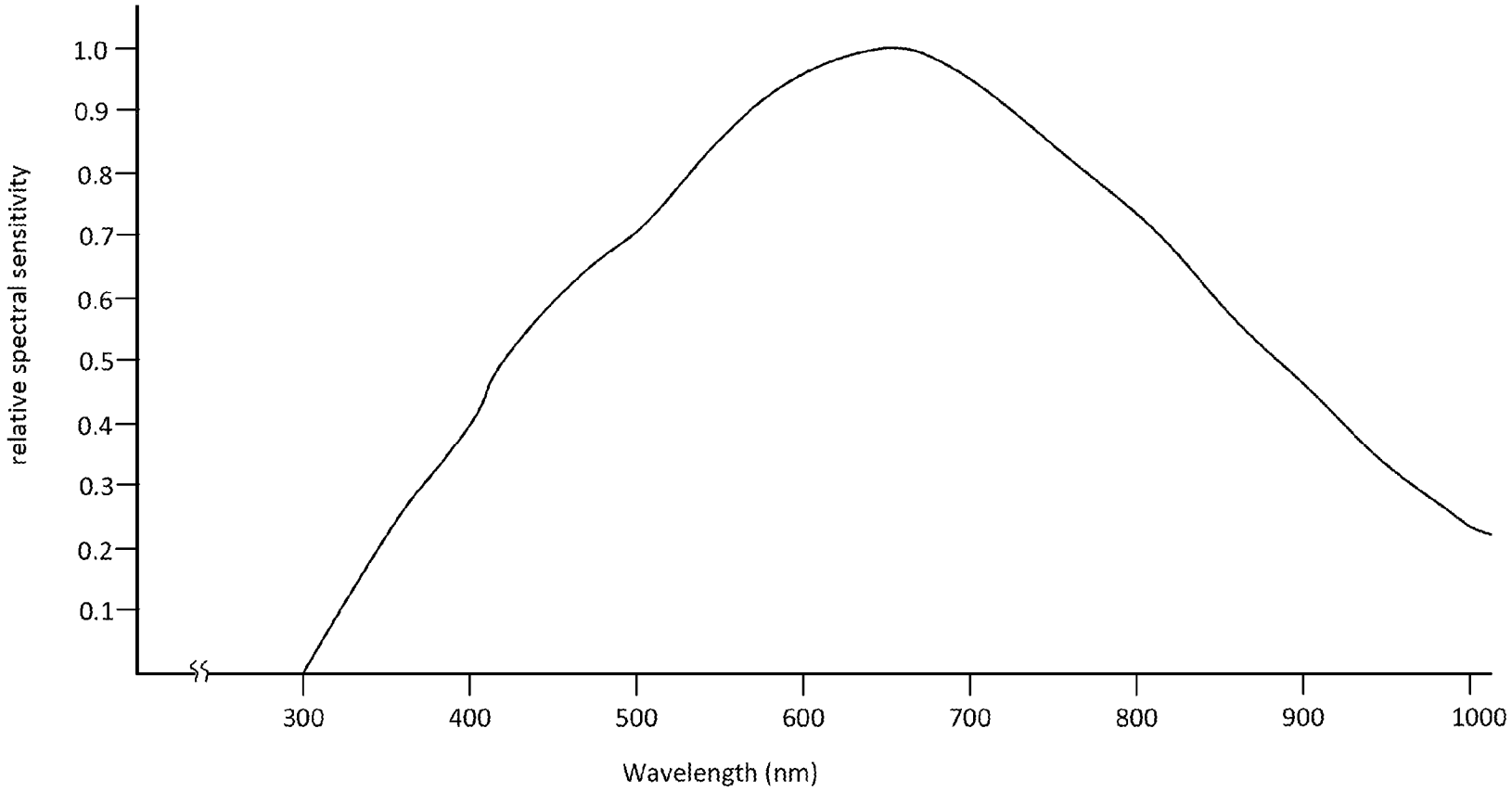
FIG. 1 illustrates an exemplary spectral response of a photodetector without any spectral response shaping.
Figure 2:
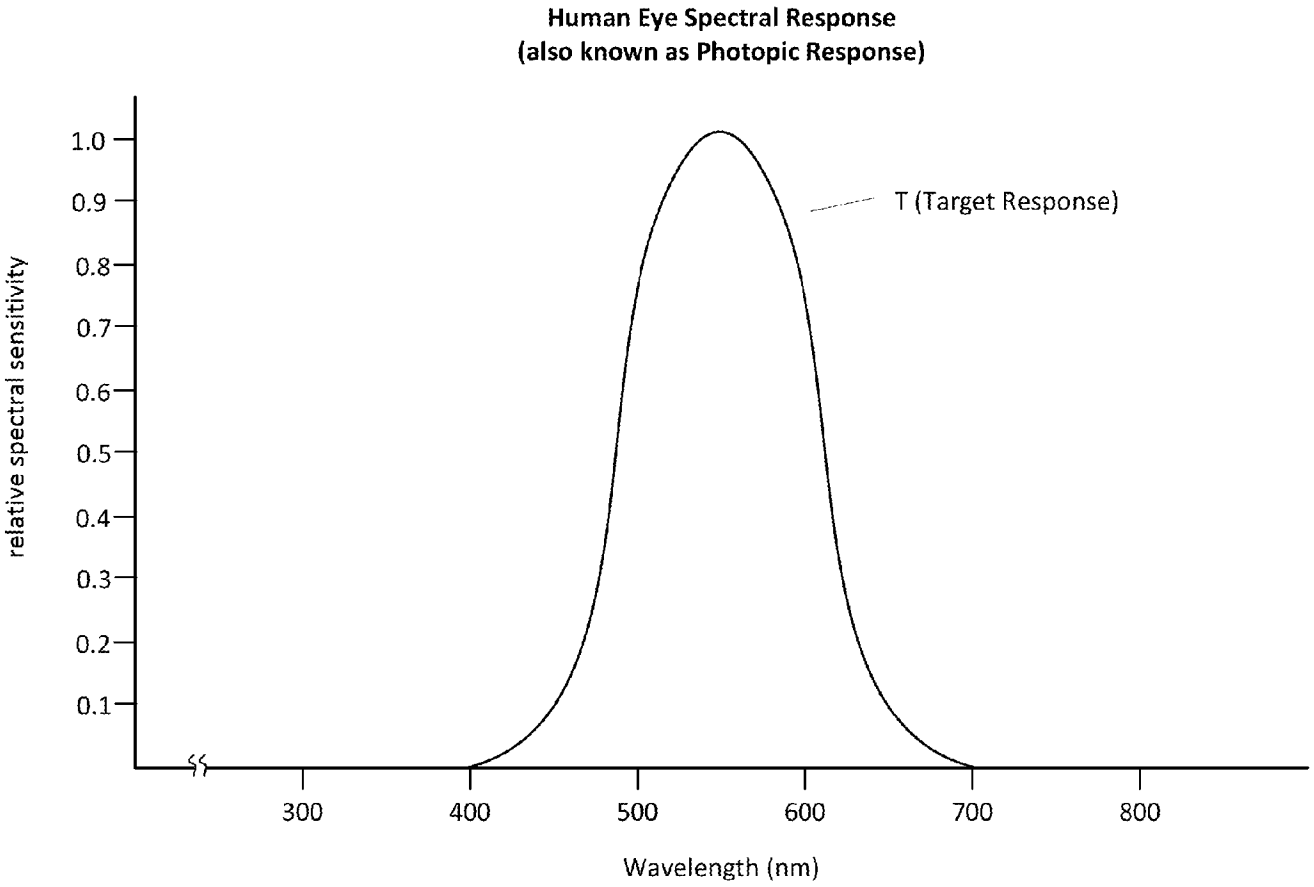
FIG. 2 illustrates the spectral response of a typical human eye, which is also known as the photopic response.

FIG. 1 shows an exemplary spectral response of a photodetector without any spectral response shaping, e.g., using a filter covering the detector. FIG. 2 illustrates the spectral response of a typical human eye, which is also known as the photopic response. As can be appreciated from FIGS. 1 and 2, a problem with using a photodetector as an ambient light sensor is that it detects both visible light and non-visible light, such as IR light, which starts at about 700 nm. By contrast, notice from FIG. 2 that the human eye does not detect IR light. Thus, the response of a photodetector can significantly differ from the response of a human eye, especially when the light is produced by an incandescent light, which produces large amounts of IR light. This would provide for significantly less than optimal adjustments if the photodetector were used as an ambient light sensor, e.g., for adjusting backlighting, or the like.

Another problem with using a photodetector as an ambient light sensor is that a photodetector will produce a relatively small electric current even when no light is incident upon the photodetector. This current, often referred to as a dark current or a leakage current, occurs due to the random generation of electrons and holes within depletion regions of a device that are then swept by a high electric field. This leakage or dark current also adversely affects that photodetector output when there are very low levels of light.

Figure 3A:
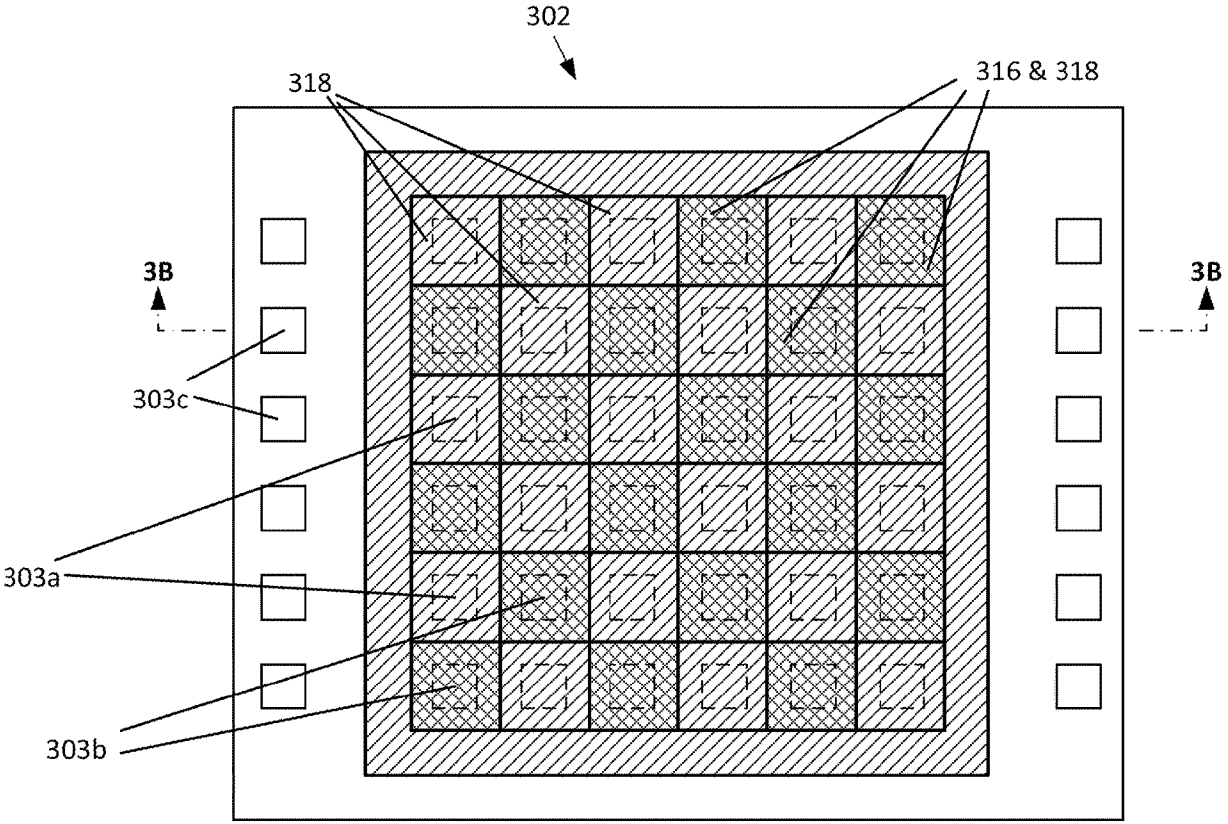
FIG. 3A illustrates a top view of a photodetector according to an embodiment.

FIG. 3A illustrates a top view of a photodetector 302 according to an embodiment. In the exemplary embodiment shown, the photodetector 302 includes an array of 8×6 photodiode regions 303, which are represented by forty-eight equally sized squares in FIG. 3A. The photodiode regions 303 can individually be referred to as a photodiode region 303, and collectively be referred to as photodiode regions 303. A sub-array of 6×6 photodiode regions 303 are covered by an optical filter 318. More specifically, half of the sub-array of 6×6 photodiode regions 303 are covered by the optical filter 318 and also by a light blocking material 316, and the other half of the sub-array of 6×6 photodiode regions 303 is covered by the optical filter 318 but not by the light blocking material 316. The remaining two sub-arrays of 1×6 photodiode regions 303 (shown at the left and right of FIG. 3A, and the left and the right of FIG. 3B discussed below)

are not covered by the optical filter 318 and are not covered by the light blocking material 316, and thus, can be referred to as uncovered photodiode regions or naked photodiode regions. The sizes of these arrays and sub-arrays are exemplary, and can be changed while still being within the scope of an embodiment. The photodiode regions that are covered by the optical filter 318, but are not covered by the light blocking material 316, are labeled 303a. The photodiode regions that are covered by the optical filter 318 and the light blocking material 316 are labeled 303b. The naked photodiode regions are labeled 303c. In alternative embodiments, the photodiode regions 303 are not all equally sized, e.g., the naked photodiode regions 303c can be smaller than the photodiode regions 303a and 303b.

Figure 3B:
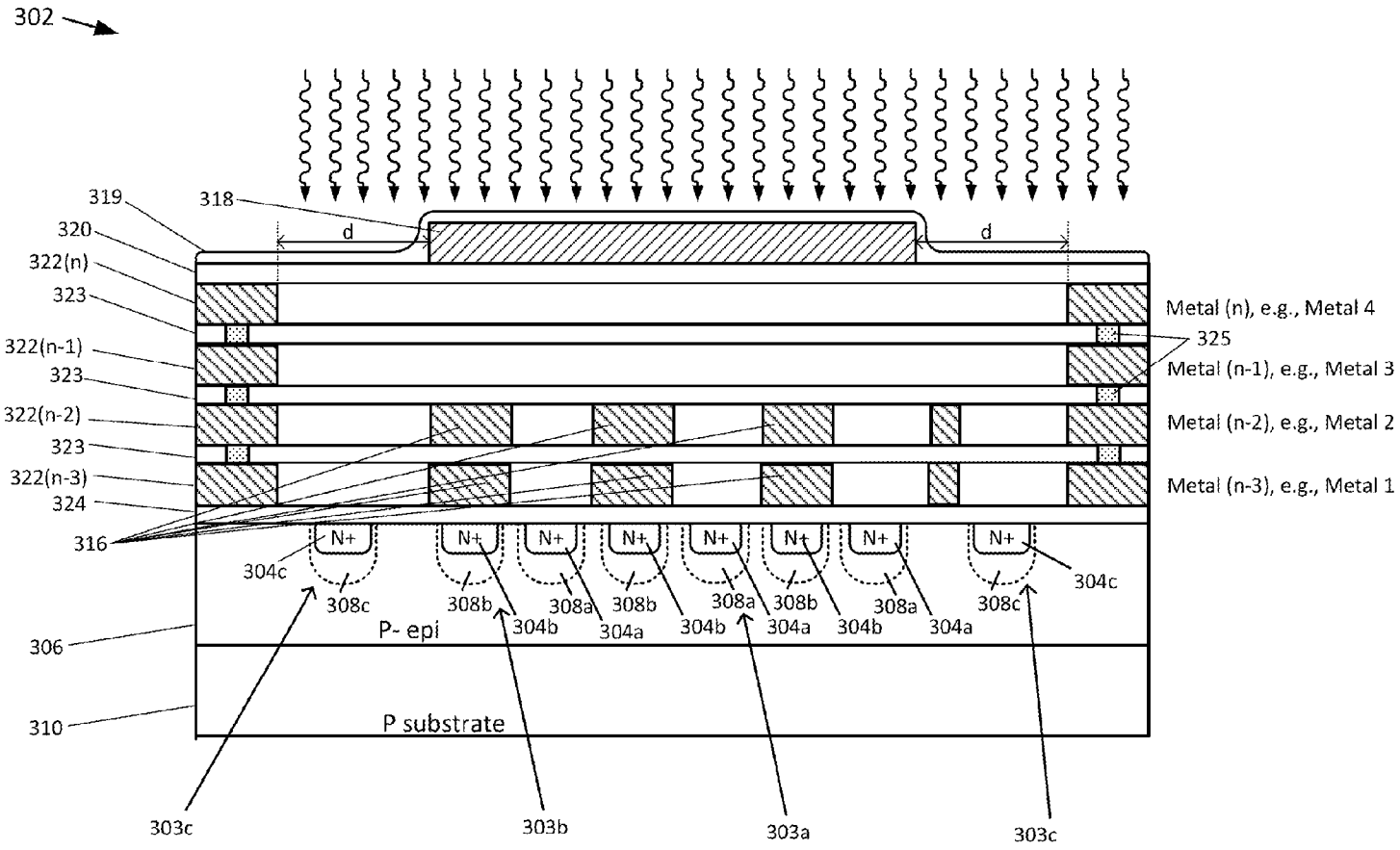
FIG. 3B illustrates a cross section of the photodetector of FIG. 3A along the line 3B-3B.

FIG. 3B illustrates a cross section of the photodetector 302 along the line 3B-3B shown in FIG. 3A. Referring to FIG. 3B, the photodetector 302 is formed on or within a substrate (e.g., a silicon wafer). In the embodiment shown, the photodetector 302 includes a plurality of $N^+$ regions 304 that are implanted in a $P^-$ epi region 306, which is grown on a P substrate 310. Each of the plurality of photodiode regions 303 (forty eight photodiode regions in the example of FIG. 3A, and forty photodiode regions in the example of FIG. 3C) is formed by a separate PN junction, each of which is reversed biased, thereby forming separate depletion regions 308. Preferably, the $P^-$ epi region 306 is very lightly doped. Placing the $N^+$ regions 304 in a $P^-$ epi region 306 provides improved quantum efficiency as compared to placing the $N^+$ regions 304 directly in the P substrate 310. Although not preferred, the $N^+$ regions 304 can alternative be placed directly in a P substrate. It is also noted that each of the photodiode regions can alternatively be formed by a PIN junction, which is similar to a PN junction, but includes a lightly doped intrinsic semiconductor region between the $N^+$ and P type region/substrate. Photodiode regions can be formed in other manners, such as, but not limited to, forming using $P^+$ regions in an $N^-$ epi region or in an $N^+$ substrate.

Still referring to FIG. 3B, the $N^+$ regions 304a, and more generally the photodetectors 303a, are covered by the optical filter 318. The $N^+$ regions 304b, and more generally the photodetectors 303b, are covered by both the light blocking material 316 and the optical filter 318. The $N^+$ regions 304c, and more generally the photodetectors 303c, are neither covered by the light blocking material 316 nor the optical filter 318, and thus, can be referred to as uncovered photodiode regions or naked photodiode regions. As discussed below, in certain embodiments, metal apertures can be used to limit the amount of light that is incident on the naked photodiode regions. Also shown is thin oxide layer 324, e.g., silicon dioxide ($SiO_2$), which covers the $N^+$ diffusion regions 304.

As can be seen in FIG. 3B, there are a plurality of metal layers 322 and a plurality inter-level dielectric (ILD) layers 323 between photodiode regions 303 and the optical filter 318, wherein such layers 322 and 323 are formed during a back end of line (BEOL) process. For the embodiment in FIG. 3B, it is assumed that the BEOL process used when producing the photodetector 302 supports four metal layers 322, which are separated from one another by three ILD layers 323. The upper most metal layer is referred to as metal layer 322(n), with layers below the upper most layer being referred to as metal layers 322(n−1), 322(n−2) and 322(n−3), where n refers to the total number of metal layers. Accordingly, where there are four metal layers, n=4, and the uppermost layer can be referred to as metal layer 322(4) (or, simply as "metal-4"), and the lowest metal layer can be referred to as metal layer 322(1) (or, simply as "metal-1").

In alternative embodiments, there can be more or less than four metal layers 322, and more or less than three ILD layers 323. Each of the metal layers 322 can have a thickness of approximately 0.5 to 1.5 microns (i.e., 0.5 u to 1.5 u, where a micron is also known as a micrometer, and is equal to 10,000 Angstroms), but is not limited thereto. Each of the ILD layers 323 can have a thickness of approximately 1 u, but is not limited thereto.

The uppermost metal layer 322(n) is covered by a passivation layer 320, which can include, but is not limited to, silicon nitride (SiN) and/or an oxide. The passivation layer 320 can have a thickness of approximately 0.3 u, but is not limited thereto. An optional organic clear coating 319 is shown as covering the optical filter 318 and portions of the passivation layer 320 that are not covered by the optical filter 318. An exemplary thickness of the optical filter 318 is 4 u, and more generally, 3 u to 5 u, but is not limited thereto.

The metal layers 322 are typically used to produce conductive traces for sending electrical signals between devices, distributing power, or providing electrical connections to ground. Metal via plugs 325 are used to electrically connect metal layers 322 that are on different planes. In FIG. 3B, the metal portions of each metal layer 322 are represented by diagonal fill lines that slope downward from left-to-right. As can be appreciated from FIG. 3B, each metal layer is not entirely metal. Rather, portions of each metal layer comprise an inter-metal dielectric (IMD), which is represented as the portions of each metal layer 322 that do not include the diagonal fill lines that slope downward from left-to-right. In other words, the portions of the metal layers 322 that are white correspond to dielectric portions of the metal layers 322. The IMD material and the ILD material typically both comprise the same dielectric material, and thus, the terms IMD and ILD are often used interchangeably. Such IMD and ILD dielectric materials are typically an oxide, such as, but not limited to, silicon dioxide.

As can be seen in FIG. 3B, the metal portions labeled 316, which are portions of the two lowest metal layers 322(n−2) and 322(n−3) (which in this example, are the metal-1 and metal-2 layers), provide the light blocking material 316 for the photodetector 302. As will be described in additional detail below, the photodiode regions 303 that are covered by the metal light blocking material 316 are used to compensate for leakage currents. In certain embodiments, metal portions of one or more of the metal layers 322 can also be used to form apertures for the naked photodiode regions 303c, where such metal apertures can be used limit (e.g., scale) the amount of light detected by the naked photodiode regions 303c. For an example, each naked photo diode region can be approximately 20 u×20 u, and corresponding metal apertures can be 8 u×8 u. This is just an example, which is not meant to be all encompassing. Further, it is noted that portions of the metal layers 322 that form light blocking material 316 and/or apertures can also be used to form portions of conductive traces that transmit electrical signals between devices, distribute power, or provide an electrical connection to ground.

In accordance with an embodiment, the optical filter 318 is a dielectric reflective optical coating filter. The dielectric reflective optical coating filter can be constructed from thin layers of materials such as, but not limited to, zinc sulfide, magnesium fluoride, calcium fluoride, and various metal oxides (e.g., titanium dioxide), which are deposited onto the underlying substrate. By careful choice of the exact composition, thickness, and number of these layers, it is possible to tailor the reflectivity and transmissivity of the filter 318 to produce almost any desired spectral characteristics. For example, the reflectivity can be increased to greater than 99.99%, to produce a high-reflector (HR) coating. The level of reflectivity can also be tuned to any particular value, for instance to produce a mirror that reflects 90% and transmits 10% of the light that falls on it, over some range of wavelengths. Such mirrors have often been used as beam splitters, and as output couplers in lasers. Alternatively, the filter 318 can be designed such that the mirror reflects light only in a narrow band of wavelengths, producing a reflective optical filter.

High-reflection coatings work the opposite way to anti-reflection coatings. Generally, layers of high and low refractive index materials are alternated one above the other. Exemplary high refractive index materials include zinc sulfide (refractive index=2.32) and titanium dioxide (refractive index=2.4), and exemplary low refractive index materials include magnesium fluoride (refractive index=1.38) and silicon dioxide (refractive index=1.49). This periodic or alternating structure significantly enhances the reflectivity of the surface in the certain wavelength range called band-stop, which width is determined by the ratio of the two used indices only (for quarterwave system), while the maximum reflectivity is increasing nearly up to 100% with a number of layers in the stack. The thicknesses of the layers are generally quarter-wave (then they yield to the broadest high reflection band in comparison to the non-quarter-wave systems composed from the same materials), designed such that reflected beams constructively interfere with one another to maximize reflection and minimize transmission. Using the above described structures, high reflective coatings can achieve very high (e.g., 99.9%) reflectivity over a broad wavelength range (tens of nanometers in the visible spectrum range), with a lower reflectivity over other wavelength ranges, to thereby achieve a desired spectral response. By manipulating the exact thickness and composition of the layers in the reflective stack, the reflection characteristics can be tuned to a desired spectral response, and may incorporate both high-reflective and anti-reflective wavelength regions. The coating can be designed as a long-pass or short-pass filter, a bandpass or notch filter, or a mirror with a specific reflectivity.

One way to deposit the optical filter 318, assuming it is a dielectric reflective optical coating filter, is using sputter deposition. Sputter deposition is a physical vapor deposition (PVD) method of depositing thin films by sputtering, which involves the ejecting of material from a "target" that is a source onto a "substrate", such as a silicon wafer. There are various different types of sputter deposition techniques, including, but not limited to ion-beam sputtering (IBS), reactive sputtering, and ion-assisted sputtering (IAD). Benefits of using sputter deposition are that the resulting optical filter 318 is physically hard and is less sensitive to irregularities in metal patterns underneath the filter. However, disadvantages of using sputter deposition is that sputtering processes are very slow, difficult and expensive to pattern. Sputter deposition is very slow due to the relative long amount of time required to perform lift off processes used when patterning the optical filter 318. Typically the longer the deposition process, the more expensive. Additionally, due to its difficulty, there are very few venders that are capable of producing optical filters using sputter deposition, which further increases costs because there is less competition, as well as because of the potential need to ship wafers from one vender to another, where the venders may be geographically far apart from one another.

In accordance with specific embodiments, evaporative deposition is used instead of sputter deposition. Benefits of using an evaporative deposition process is that it is significantly faster, easier and less expensive than sputter deposition. Additionally, substantially the same optical performance can be achieved using evaporative deposition as compared to sputter deposition. However, an optical filter (and more generally, a coating) produced using evaporative deposition may not be as robust to manufacture and handling as compared to an optical filter (and more generally, a coating) produced using a sputter deposition process. For example, tests have proved that when evaporative deposition is used to produce the optical filter 318, the optical filter 318 and the passivation layer 320 are prone to cracking if the photodetector is not laid out in a manner that prevents such cracking Detrimentally, such cracks can cause poor photodetector performance, and can propagate down through the passivation layer 320 thereby reducing the reliability and useful life of the photodetector.

Certain embodiments are directed to techniques for avoiding such cracking, and photodetectors produced using such techniques. The inventors have discovered that a reason for such cracking was the relatively close proximity of metal to the optical filter 318. More specifically, temperature cycling caused the metal to expand and contract resulting in cracking of the optical filter 318 and the passivation layer 320. The inventors also discovered that by not having any metal directly below the optical filter 318, in the uppermost metal layer 322(n) (which is the metal-4 layer in FIG. 3B), the aforementioned cracking was prevented. This is shown in FIG. 3B, which shows that there is no metal in the portion of the uppermost metal layer 322(n) that is underlying the optical filter 318. To further reduce the chance of such cracking, there is also no metal in the portion of the second highest metal layer 322(n−1) (which is the metal-3 layer in FIG. 3B) that is underlying the optical filter 318. Additionally, to further reduce the chance of cracking the optical filter 318, any metal that is included in the uppermost metal layer 322(n) is at least a predetermined distance "d" from the periphery of the optical filter 318, where d is approximately 20 microns (i.e., 20 u, where a micron is also known as a micrometer, and is equal to 10,000 Angstroms). In the above mentioned embodiments, the IMD of the uppermost metal layer 322(n), and potentially the second most upper layer 322(n−1), act as a buffer layer(s) that reduces stresses from thermal expansion of underlying metal portions of the two lowest metal layers 322(n−2) and 322(n−3).

In FIG. 3B, metal portions (labeled 316) of the metal layers 322(n−2) and 322(n−3), which are the lowermost and second lowermost metal layers, are used to provide the light blocking material 316. Alternatively, metal portions of just one of the layers 322(n−2) or 322(n−3) can be used to provide the light blocking material 316.

Figure 3C:
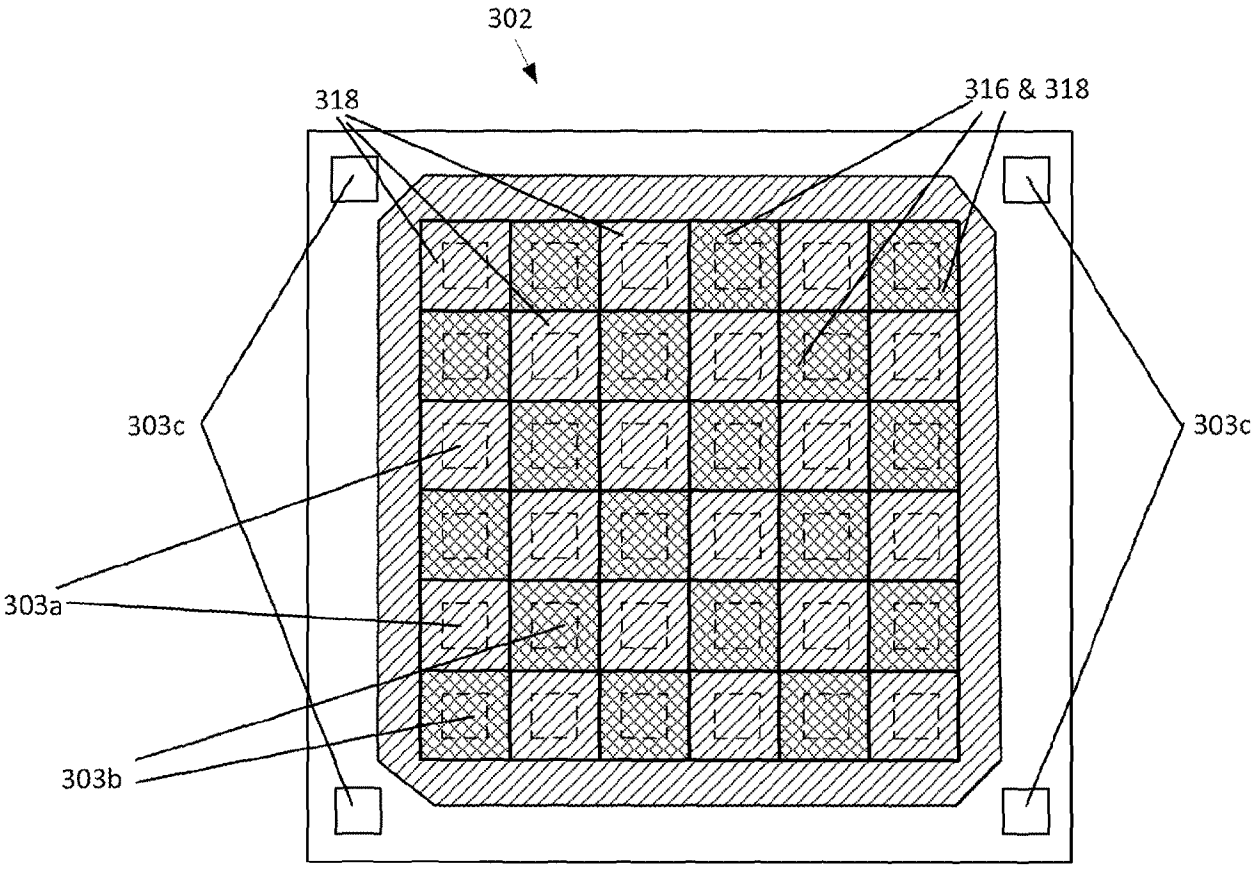
FIG. 3C illustrates a top view of a photodetector according to another embodiment.

The inventors also discovered that avoiding the use of 90 degree angles in the outer periphery of the optical filter 318 also reduces the chance of the optical filter 318 cracking. An example of how this can be done is shown in FIG. 3C. More generally, it is desired that all angles of the outer periphery of the optical filter 318 are obtuse, i.e., greater than 90 degrees. This is beneficial because relatively sharp angled peripheral corners (i.e., peripheral corners having an angle of 90 degrees or less) have been shown to initiate cracking of the optical filter 318. FIG. 3C also shows that in an alternative embodiment, the naked photodiode regions 303c can be located in only the four corners of the photodetector 302. The beveled periphery of the optical filter 318 shown in FIG. 3C makes it practical to include the naked photodiode regions at the corners. This configuration is also more compact compared to the configuration in FIG. 3A, in that it reduces the die area dedicated to the naked photodiode regions.

The inventors also discovered that it is better to use a negative polarity mask when patterning the optical filter 318, because the lift-off process using the negative polarity mask achieves smoother surfaces, which is especially beneficial if the die within which the photodetector 302 is being produced will also include an organic filter. For example, the die may also include an additional photodetector used for optical proximity sensing, which is to be covered by an organic filter.

In accordance with specific embodiments, the photodetector 302 is designed such that its output has a spectral response that is similar to that of a typical human eye response (shown in FIG. 2), which as mentioned above, is known as the photopic response. For the remainder of this discussion, unless stated otherwise, it will be assumed that the photodetector 302 is designed such that its output has a spectral response that is similar to the photopic response shown in FIG. 2.

While not specifically shown, the $N^+$ regions 304a covered by the optical filter 318 (but not by the light blocking material 316) are electrically connected together in an embodiment and produce a first current ($I_1$), which is indicative of light (if any) incident on the $N^+$ regions 304a and a leakage current. In accordance with an embodiment, the optical filter 318 is designed to pass visible light and reject (e.g., reflect) IR light. Nevertheless, some IR light will still passes through the optical filter 318. Accordingly, when light including visible light and IR light is incident on the photodetector 302, the portion of the light incident on the $N^+$ regions 304a will include both visible light, as well as some IR light that passes through the optical filter 318. Thus, when light including visible light and IR light is incident on the photodetector 302, the first current ($I_1$) will be indicative of visible light, a small portion of IR light that passes through the optical filter 318, and a small leakage current.

While not specifically shown, the $N^+$ regions 304b covered by both the light blocking material 316 and the optical filter 318 are electrically connected together in an embodiment and produce a second current ($I_2$), which is indicative of a fraction of the IR light (if any) that penetrates deep into to the $P^-$ epi region 306, as will be explained in some more detail below, and a small leakage current. This second current ($I_2$) is substantially unaffected by visible light.

When light including visible light and IR light is incident on the photodetector, one or more of the naked $N^+$ regions 304c produce a third current ($I_3$), which is indicative of visible light, IR light, and a small leakage current.

Additional details of how the first and second currents ($I_1$ and $I_2$) are generated and how they can be used are now provided. Thereafter, additional details of how the third current ($I_3$) is generated and how it can be used is provided.

Still referring to FIG. 3B, when light is incident on the photodetector 302, carriers are not generated in the depletion regions 308b corresponding to $N^+$ 304b regions covered by both the light blocking material 316 and the reflective filter 318, because no light is incident on $N^+$ regions 304b covered by the light blocking material 316. The light incident on $N^+$ regions 304a that are covered by reflective filter 318 (but not covered by the light blocking material 316) generate carriers in the corresponding depletion regions 308a, which are quickly captured in the $N^+$ regions 304a which are electrically connected together. However, the slow carriers generated below the depletion regions 308a (due to long wavelength TR light that penetrates deeply into to the $P^-$ epi region 306) wander around for a while before eventually entering an electric field and then getting captured. After wandering around (e.g., in a left or right direction), some of the slow carriers will eventually be captured by one of the $N^+$ regions 304b covered by the light blocking material 316. In fact, about half of the slow carriers are eventually captured by the $N^+$ regions 304b covered by the light blocking material 316 and the other half are captured by $N^+$ regions 304a not covered by the light blocking material 316. This half and half capture is due to the substantially random behavior of the slow carriers, the similar shape of each $N^+$ region 304a and 304b, the fact that a layout area associated with the $N^+$ regions 304a is substantially equal to a layout area associated with the $N^+$ regions 304b, and the substantially identical biasing of each PN junction.

The carriers that are captured by the $N^+$ regions 304a that are only covered by the optical filter 318 (but not covered by the light blocking material 316) produce the first current ($I_1$) a majority of which is created immediately by the quickly captured carriers (also referred to as fast carriers). A small portion of the first current ($I_1$) is due to later captured slow carriers, and a further small portion of the first current ($I_1$) is also due to leakage current.

The carriers captured by the $N^+$ regions 304b, covered by both the light blocking material 316 and the optical filter 318, produce the second current ($I_2$), a portion of which is a deferred current produced by later (i.e., deferred) captured slow carriers, and a portion of which is leakage current.

When light is incident on the photodetector 302, the portions of first current ($I_1$) and the second current ($I_2$) that are due to leakage current are relatively small compared to the portions of due to visible light and/or IR light. However, when light is not incident (or only a very low level of light is incident) on the photodetector 302, significant portions of the first current ($I_1$) and the second current ($I_2$) are primarily indicative of leakage current. By subtracting the second current ($I_2$) from the first current ($I_1$), the leakage currents should cancel each other out.

Figure 4A:
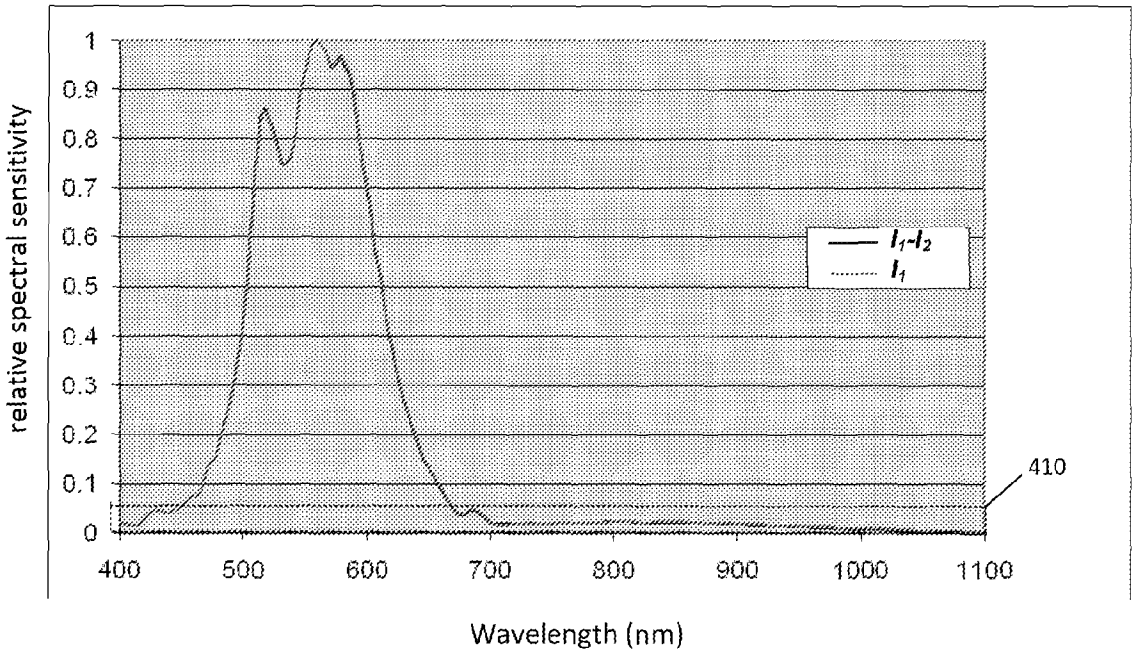
FIG. 4A is a graph that illustrates exemplary spectral responses that can be achieved using the photodetector of FIGS. 3A and 3B, or the photodetector of FIG. 3C.
Figure 4B:
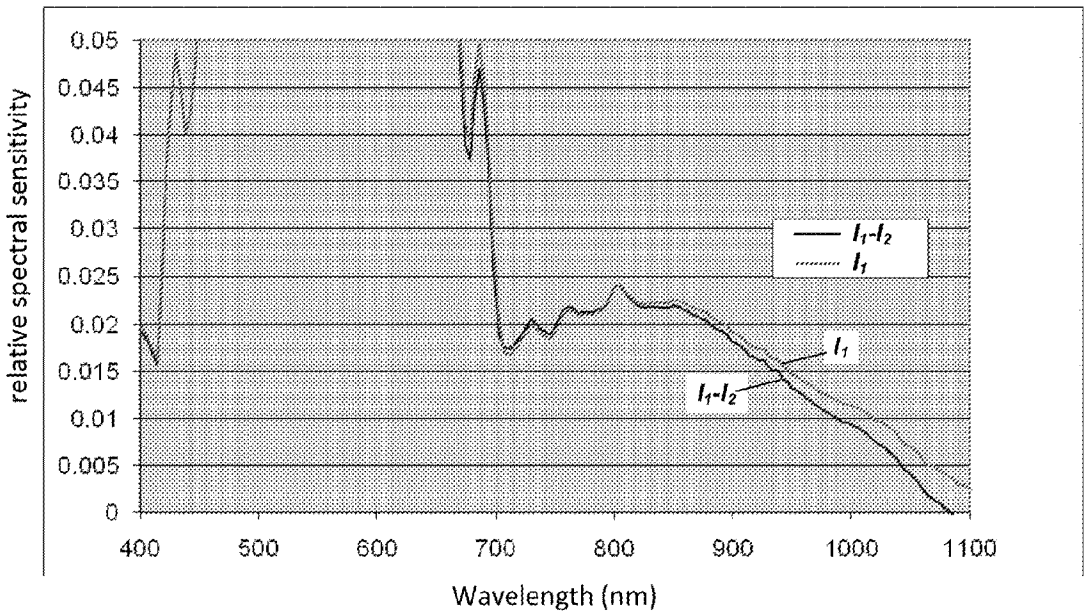
FIG. 4B is a graph that illustrates additional details of a portion of the graph of FIG. 4A.

Referring back to FIG. 2, the photopic response, which is the target response for an ambient light sensor, is from about 400 nm to about 700 nm, with the peak spectral response of the human eye at about 555 nm. FIG. 4A is an exemplary graph showing a spectral response corresponding to the first current ($I_1$), as well as a spectral response corresponding to the first current ($I_1$) minus the second current ($I_2$), when light is incident on the photodetector 302. FIG. 4B is a graph that illustrates additional details of a portion 410 of the graph of FIG. 4A. Comparing FIGS. 4A and 4B to FIG. 2, it can be appreciated that when light is incident on the photodetector 302 the spectral response corresponding to the first current ($I_1$), as well as the spectral response corresponding to the first current ($I_1$) minus the second current ($I_2$), is affected by IR light above 700 nm. In other words, above 700 nm the spectral response corresponding to the first current ($I_1$), as well as the spectral response corresponding to the first current ($I_1$) minus the second current ($I_2$), differs more than desired from the target spectral response of FIG. 2. Because the slow carriers will be canceled out when subtracting the second current ($I_2$) from the first current ($I_1$), it can be appreciated from FIG. 4B, that the response for the first current ($I_1$) minus the second current ($I_2$) is slightly closer to the desired spectral response than the spectral response for the first current ($I_1$) alone.

As will now be explained, in accordance with specific embodiments, a spectral response closer to a target response (e.g., the photopic response) can be achieved by subtracting at least a portion of a third current ($I_3$) from the from the first current ($I_1$) minus the second current ($I_2$).

Referring back to FIGS. 3A and 3B, when light is incident on the photodetector 302, one or more of the $N^+$ regions 304c (that are neither covered by the light blocking material 316 nor by the optical filter 318) produce the third current ($I_3$), which is indicative of visible light, IR light, and a small leakage current. As was the case with the first and second currents ($I_1$ and $I_2$), when light is incident on the photodetector 302, the portion of the third current ($I_3$) due to leakage current is very small. An exemplary spectral response corresponding to the first current ($I_3$) is the spectral response shown in FIG. 1. Notice from FIG. 1 that the spectral response corresponding to the first current ($I_3$) is significantly affected by IR light above 700 nm.

Figure 5A:
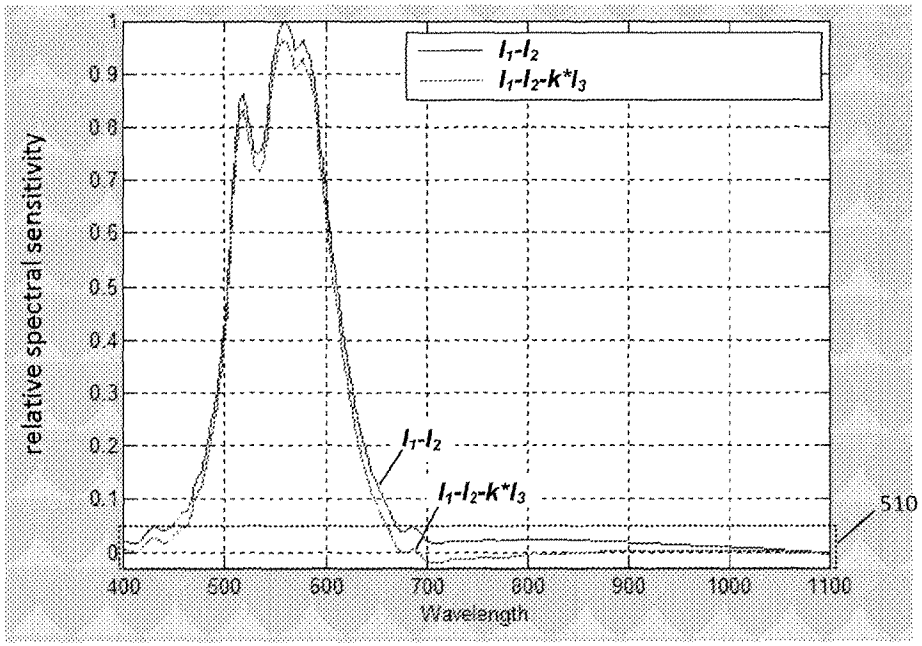
FIG. 5A is a further graph that illustrates exemplary spectral responses that can be achieved using the photodetector of FIGS. 3A and 3B, or the photodetector of FIG. 3C.
Figure 5B:
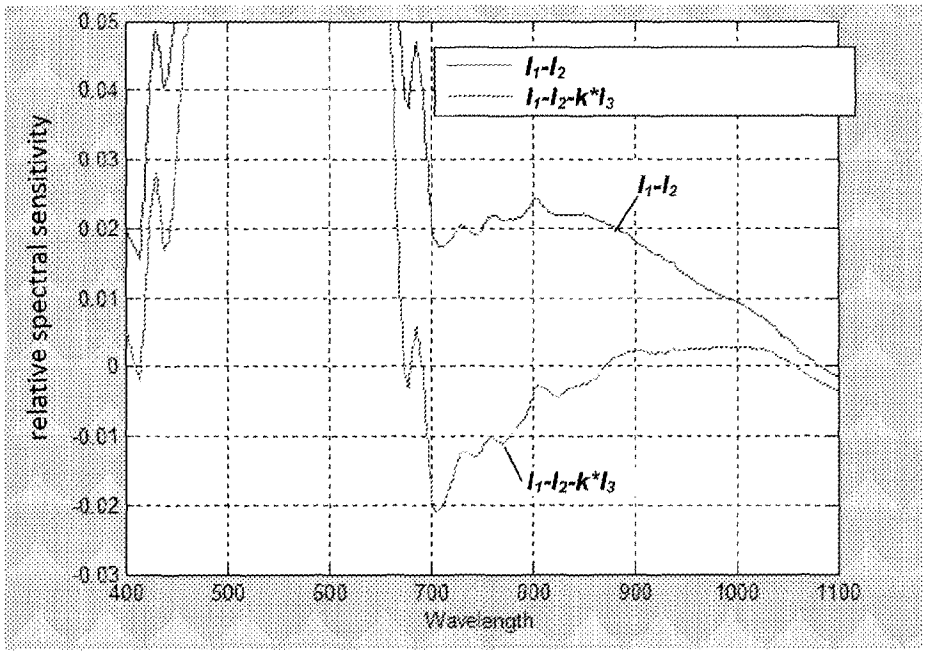
FIG. 5B is a graph that illustrates additional details of a portion of the graph of FIG. 5A.

FIG. 5A is an exemplary graph showing a spectral response corresponding to the first current ($I_1$) minus the second current ($I_2$), as well as a spectral response corresponding to the first current ($I_1$) minus the second current ($I_2$) minus a scaled version of the third current ($I_3$) (e.g., $k*I_3$) when light is incident on the photodetector 302. FIG. 5B is a graph that illustrates additional details of a portion 510 of the graph of FIG. 5A. Comparing FIGS. 5A and 5B to FIG. 2, it can be appreciated that when light is incident on the photodetector 302 the spectral response corresponding to the first current ($I_1$) minus the second current ($I_2$) minus a scaled version of the third current ($I_3$) is closer to the target response of FIG. 2 than the spectral response corresponding to the first current ($I_1$) minus the second current ($I_2$).

FIGS. 5A and 5B illustrate that IR rejection can be significantly improved without much reduction in visible light response, because the third current ($I_3$) used in the subtraction is significantly smaller than first current ($I_1$). The third current ($I_3$) (or the scaled version thereof) is at least one order of magnitude, and preferably at least two orders of magnitude, smaller than the first current ($I_1$) (or the scaled version thereof) from which the third current ($I_3$) (or the scaled version thereof) is being subtracted. This provides for significant improvement in IR rejection without much reduction in visible light response. This also means that the portion of the third current ($I_3$) (or the scaled version thereof) that is due to leakage current will be extremely small compared to the portions of the first and second currents (or scaled versions thereof) that are due to leakage current, and thus, that the portion of the third current ($I_3$) (or the scaled version thereof) that is due to leakage current can be ignored because it is so insignificant. The precise amount of the third current ($I_3$) from which to subtract from the first current ($I_1$) (or a scaled version thereof) can be determined using simulations and/or empirically. For example, the scaling factor (k) for the third current ($I_3$) can be determined using simulations and/or empirically.

Figure 6:
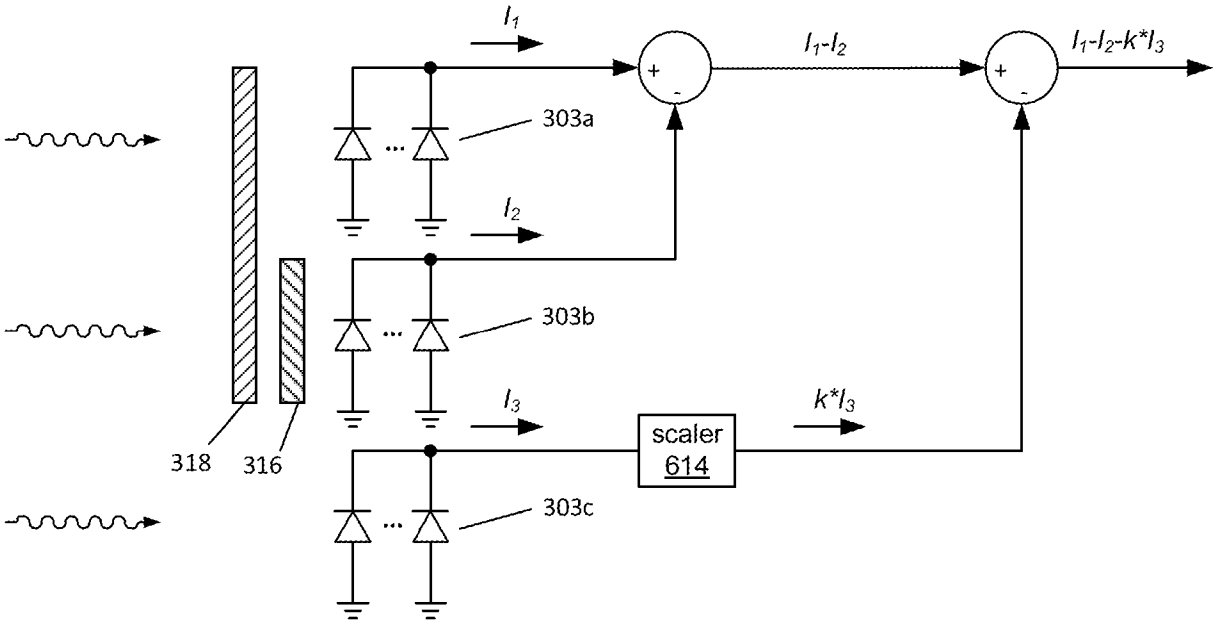
FIG. 6 is high level diagram used to illustrate how currents and/or other signals can be combined in accordance with specific embodiments.

FIG. 6 is a high level diagram used to illustrate how currents and/or other signals can be combined in accordance with specific embodiments. In FIG. 6, a generic block 614 shown as a "scaler" is shown in only one of the signal paths, but can be in additional or alternative signal paths. Such a scaler can be used to trim or amplify a signal, as will be explained in more detail below. In certain embodiments, metal apertures above the naked photodiode regions 303c, which were discussed above, can be used to perform at least a portion of the scaling. There are various types of well known circuitry that can be used to subtract currents and/or other types of signals. For example, differential input amplifiers can be used to determine the difference between two signals. For another example. current mirrors can be used to perform subtractions. These are just a few examples, which are not meant to be limiting.

Referring to FIG. 6, one or more photodiode regions 303a are covered by the optical filter 318 configured to reject IR wavelengths and produce the first current ($I_1$). Referring back to FIGS. 3A-3C, each photodiode region 303a in FIG. 6 can correspond to a PN junction formed by an $N^+$ diffusion region 304a and the underlying P type surface region 306, where the $N^+$ diffusion region 304a is covered by the optical filter 318 but not covered by the light blocking material 316. Referring again to FIG. 6, one or more photodiode regions 303b are covered by the light blocking material 316 and the optical filter 318 configured to reject IR wavelengths and produce the second current ($I_2$). Referring back to FIGS. 3A-3C, each photodiode region 303b in FIG. 6 can correspond to a PN junction formed by an $N^+$ diffusion region 304b and the underlying P type surface region 306, where the N+ diffusion region 304b is covered by the optical filter 318 and the light blocking material 316. Referring again to FIG. 6, one or more photodiode regions 303c are not covered by the light blocking material 316 and not covered the optical filter 318 configured to reject IR wavelengths and produce the third current ($I_3$). Referring back to FIGS. 3A-3C, each photodiode region 303c in FIG. 6 can correspond to a PN junction formed by an $N^+$ diffusion region 304c and the underlying P type surface region 306, where the N+ diffusion region 304c is not covered by the optical filter 318 and not covered by the light blocking material 316.

In the above described embodiments, the one or more photodiode regions 303b that are covered by the light blocking material 316 are also described and shown as being covered by the optical filter 318 configured to reject IR light. As can be appreciated from FIGS. 3A-3C, this is a practical way of fabricating the photodetector 302, especially where photodiode regions 303a and 303b are interlaced in a checkerboard pattern, as shown in FIG. 3A. However, it is noted that it is not necessary that the photodiode regions 303b that are covered by the light blocking material 316 also be covered by the optical filter 318, since for these photodiode regions 303b the light that passes through the filter 318 will eventually get blocked by the light block material 316 and will not reach the photodiode region 303b anyway. It is also possible that the photodiode regions 303 be laid out in other manners other than the generally checkerboard pattern shown in FIGS. 3A-3C.

Figure 7:
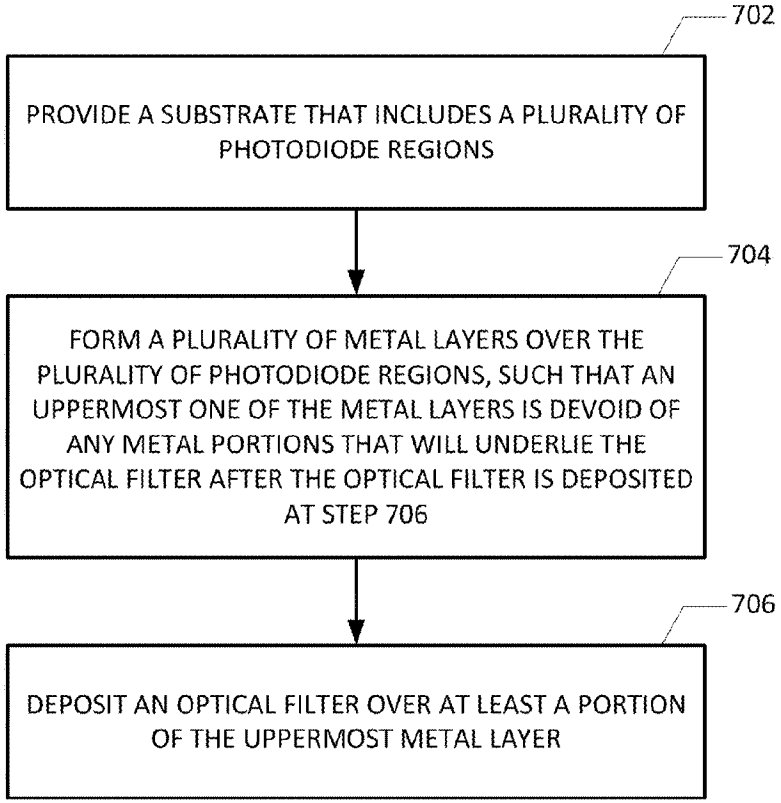
FIG. 7 is a high level flow diagram that is used to summarize methods for use in manufacturing a photodetector in accordance with specific embodiments.

FIG. 7 is a high level flow diagram that is used to summarize a method for use in manufacturing a photodetector that includes an optical filter that shapes a spectral response of the photodetector. Referring to FIG. 7, at step 702, a substrate including a plurality of photodiode regions is provided. An exemplary layout of the photodiode regions were described above with reference to FIGS. 3A-3C. However, other layouts are also possible. Since it is well known how to produce photodiode regions, this step need not be described in additional detail.

At step 704, a plurality of metal layers are formed over the plurality of photodiode regions. The plurality of metal layers include a lowermost metal layer that is closest to the photodiode regions (and furthest from the optical filter) and an uppermost metal layer that is farthest from the photodiode regions (and closest to the optical filter). In the example of FIG. 3B, the lowermost metal layer is the metal-1 layer labeled 322(n–3), and the uppermost metal layer is the metal-4 layer labeled 322(n). Each of the metal layers includes one or more metal portions and one or more dielectric portions. In the example of FIG. 3B, the metal portions of each metal layer 322 are represented by diagonal fill lines that slope downward from left-to-right, and the dielectric portions are represented as the portions of each metal layer 322 that do not include the diagonal fill lines that slope downward from left-to-right (i.e., the dielectric portions of the each metal layer 322 is completely white). To reduce the chance of the optical filter (deposited at step 706) cracking, step 704 is performed such that the uppermost metal layer is devoid of any metal portions that will underlie the optical filter after it is deposited (at step 706).

At step 706, an optical filter is formed over at least a portion of the uppermost metal layer. Referring back to FIG. 3B, the optical filter is labeled 318, and it can be appreciated that the uppermost metal layer 322(n) is devoid of any metal portions that underlie the optical filter 318 after it is deposited. In accordance with specific embodiments, the optical filter is a dielectric reflective optical coating that is deposited using an evaporative deposition process. Advantages of using an evaporative deposition process have been described above. As was explained above, the dielectric reflective optical coating type of optical filter, or an alternative type of optical filter, can be configured to reject IR light, and more specifically, can be configured to provide a photopic response. Alternative types of responses are also possible and within the scope of an embodiment.

In specific embodiments, the optical filter is deposited such that an outer periphery of the optical filter include obtuse angles and is devoid any angles that are equal to or less than 90 degrees. An example of such an optical filter was shown in, and described with reference to, FIG. 3C. As was described above with reference to FIG. 3C, such embodiments should reduce the likelihood of the optical filter 318 cracking, since it has been shown that such cracking typically originates at relatively sharp angled peripheral corners (i.e., peripheral corners having an angle of 90 degrees or less).

Figure 8:
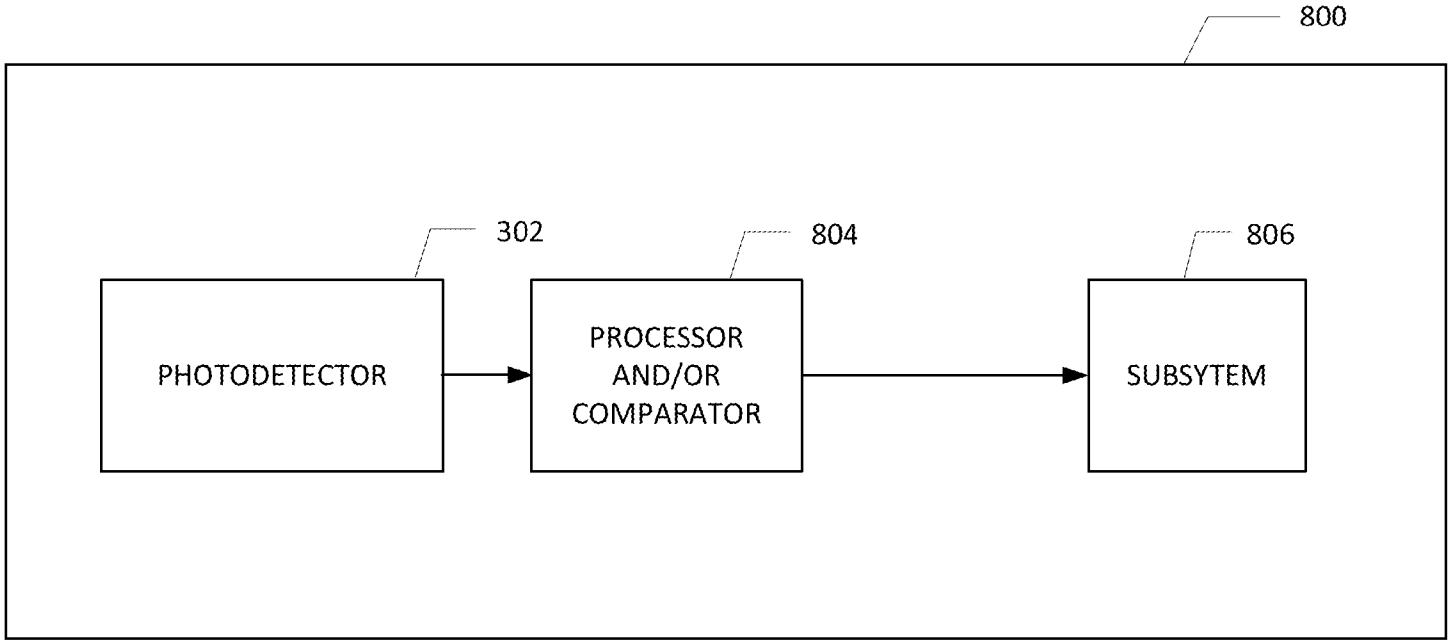
FIG. 8 is a high level block diagram of a system that includes a photodetector according to an embodiment of the present invention.

FIG. 8 is a high level block diagram of a system that includes a photodetector according to an embodiment of the present invention. Photodetectors of embodiments of the present invention can be used in various systems, including, but not limited to, mobile-phones and other handheld-devices, computer systems and/or portions thereof (e.g., a display screen).

Referring to the system 800 of FIG. 8, for example, the photodetector 302 can be used to control whether a subsystem 806 (e.g., display screen, touch-screen, backlight, virtual scroll wheel, virtual keypad, navigation pad, etc.) is enabled or disabled, and/or to adjust the brightness of the subsystem. For example, a current produced by the photodetector 302 can be converted to a voltage (e.g., by a transimpedance amplifier), and the voltage can be provided to a comparator and/or processor 804 which can, e.g., compare the voltage to one or more threshold, to determine whether to enable or disable the subsystem, or adjust the brightness of the subsystem 806. It is also possible that functionality of the transimpedance amplifier, the comparator and/or processor 804, or portions thereof, be included within the photodetector 302 and/or the subsystem 806.

In accordance with specific embodiments, the optical filter 318 is a dielectric reflective optical coating filter, exemplary details of which were discussed above. Alternative, or additionally, the optical filter 318 can be (or include) an IR absorption type filter, which can include one or more colorants, e.g., pigments or/or dyes that absorb IR light and pass visible light. For example, a green pigment provides a first approximation to a standard human eye spectral response, since green is dominant in human vision. Dyes have been developed that pass light in the visible spectrum (e.g., from about 400 to 700 nm) and absorb light in the IR spectrum. Such dyes have been, e.g., added to a transparent plastic to provide a transparent credit card that absorbs IR light, e.g., so a credit card machine can use IR light to determine whether a credit card has been inserted into a credit card reader. Such dyes are available, e.g., from Epolin, Inc, of Newark, N.J. For example, Epolight E8316 is an example die available from Epolyn, Inc. Exemplary chemical formulas for such dyes are disclosed, e.g., in U.S. Pat. No. 5,656,639 and U.S. Patent Publication No. 2009/0236571, both of which are assigned to Epolin, Inc., both of which are incorporated herein by reference. In accordance with specific embodiments, such a dye is added to a carrier material to provide a photo-patternable dyed coating that is used to provide the optical filter 318. The dyed coating can comprise a visible light passing carrier material to which is added a dye that absorbs IR light and passes visible light. The carrier material can be a negative photoresist material, an epoxy material or a filter material, but is not limited thereto. Such a carrier material can be clear, but alternatively could include a colored tint.

In the above described embodiments, the various currents that are produced can be scaled (e.g., amplified or trimmed) before and/or after being combined to produce an output (e.g., an output current). It is also possible that currents are converted to voltages and that signals are scaled in the voltage domain and then converted back to currents before being combined to produce an output. Alternatively, signals can be combined in the voltage domain. One of ordinary skill in the art will appreciate that many other ways for adjusting currents and/or voltages are within the spirit and scope of an embodiment. For example, programmable devices (e.g., a programmable digital-to-analog converter (DAC)) can be used to appropriately adjust voltages and/or currents. An advantage of using a programmable device is that it may selectively adjust the appropriate gain(s) based on additional variables, such as temperature. It is also noted that current signals or voltage signals can be converted into the digital domain and all further processing of these signals (e.g., scaling of one or more signals and determining a difference between signals) can be performed in the digital domain, rather than using analog components. Such digital domain processing can be performed using dedicated digital hardware or on a general purpose processor, such as a microprocessor.

Another way to scale currents is to selectively connect similar photodiode regions in a programmable manner. For example, rather than having all of the photodiode regions 303c permanently connected together to produce the third current ($I_3$), individual photodiode regions 303c can be selected, using individual switches (e.g., implemented using transistors), to contribute to the third current ($I_3$). Accordingly, if only one of the photodiode regions 303c is selected to contribute to the third current ($I_3$) then the third current ($I_3$) would be approximately $1/12^{th}$ that magnitude than if twelve photodiode regions 303c were selected to contribute to the third current ($I_3$). This provides a relative inexpensive and power efficient technique for scaling the third current ($I_3$) relative to the first and second currents ($I_1$) and ($I_2$). The first and second currents ($I_1$) and ($I_2$) can also be scalable in a similar manner, if desired.

Since the magnitude of the third current ($I_3$) produced using one or more naked photodiode regions 303c should be significantly smaller than the first current ($I_1$) at least one order of magnitude smaller, and likely at least two orders of magnitude smaller, the area of the photodetector 302 devoted to producing the third current ($I_3$) can be significantly smaller than the area devoted to producing the first current ($I_1$). For example, referring back to FIGS. 3A-3C, there can be significantly less N+ diffusion regions 304c compared to N+ diffusion regions 304a. Also, the size of each N+ diffusion regions 304c can be smaller than the size of the N+ diffusion regions 304a.

In the embodiments described above, the target response was often described as the photopic response. However, that need not be the case. For example, other target responses can be for the photodetector (or a portion thereof) can be to detect light of a specific color, such as red, green or blue. Such photodetectors can be used, e.g., in digital cameras, color scanners, color photocopiers, and the like. In these embodiments, the optical filter 318 can be optimized for the specific color to be detected, and can be used alone or in combination with the various techniques for filtering out IR light that happens to make it through the optical filter 318. For example, one or more photodiode regions can be optimized to detect green light, one or more further photodiode regions can be optimized to detect red light, and one or more further photodiode regions can be optimized to detect blue light. Using techniques described above, leakage current and/or IR light detected by the regions can be substantially canceled out, e.g., using photodiode regions covered by a light blocking material and/or photodiode regions not covered by an optical filter and not covered by a light blocking material.

In the above described embodiments, $N^+$ type regions are described as being implanted in a P type region. For example, the N+ diffusion region 304 is implanted in $P^-$ region 306 to form a photodiode region. In alternative embodiments, the semiconductor conductivity materials are reversed. That is, P type regions can be implanted in an $N^+$ type region. For a specific example, a heavily doped $P^+$ region is implanted in a lightly doped $N^-$ region, to form an alternative type of photodiode region 303.

Certain embodiments are also directed to methods of producing photocurrents that are primarily indicative of target wavelengths of light, e.g., wavelengths of visible light. In other words, embodiments are also directed to methods for providing a photodetector having a target spectral response, such as, a response similar to that of the human eye. Additionally, embodiments are also directed to methods of using the above described photodetector.

While various embodiments have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A photodetector, comprising:

a plurality of photodiode regions;

an optical filter [covering one] *having a continuous area that covers two* or more of the photodiode regions *that are adjacent to one another*;

a plurality of metal layers located between the photodiode regions and the optical filter, wherein the plurality of metal layers include an uppermost metal layer that is closest to the optical filter and a lowermost metal layer that is closest to the photodiode regions; and one or more inter-level dielectric layers that separate the metal layers from one another;

wherein each of the metal layers includes one or more metal portions and one or more dielectric portions; and wherein the uppermost metal layer is devoid of any metal portions underlying the optical filter.

2. The photodetector of claim 1, wherein one or more of the photodiode regions are not covered by the optical filter.

3. The photodetector of claim 1, wherein a portion of the uppermost metal layer, which is devoid of any metal portions underlying the optical filter, consists of a dielectric portion of the uppermost metal layer.

4. The photodetector of claim 1, wherein a distance between a periphery of the optical filter and a closest metal portion of the uppermost metal layer is at least 20 microns.

5. The photodetector of claim 1, wherein:

the plurality of photodiode regions include one or more first photodiode regions that are covered by the optical filter, and one *or* more second photodiode regions that are covered by a light blocking material; and the light blocking material comprises one or more metal portions of one or more of the metal layers other than the uppermost metal layer.

6. The photodetector of claim 5, wherein the one or more second photodiode regions that are covered by the light blocking material are also covered by the optical filter.

7. The photodetector of claim 5, wherein the light blocking material comprises one or more metal portions of the lowermost metal layer.

8. The photodetector of claim 5, wherein:

the plurality of metal layers, located between the photodiode regions and the optical filter, comprise at least four metal layers;

the light blocking material comprises one or more metal portions of the at least one of the two metal layers that are closest to the photodiode regions; and the two metal layers, that are closest to the optical filter, are each devoid of any metal portions underlying the optical filter.

9. The photodetector of claim 1, wherein an outer periphery of the optical filter includes obtuse angles and is devoid any angles that are equal to or less than 90 degrees.

10. The photodetector of claim 1, wherein the optical filter comprises a dielectric reflective optical coating filter configured to reject infrared (IR) light.

11. The photodetector of claim 1, wherein:

the plurality of photodiode regions include one or more first photodiode regions that are covered by the optical filter, one *or* more second photodiode regions that are covered by a light blocking material *and the optical filter*, and one or more third photodiode regions that are not covered by the optical filter and are not covered by the light blocking material; and the light blocking material comprises one or more metal portions of one or more of the metal layers other than the uppermost metal layer.

12. A method for use in manufacturing a photodetector that includes an optical filter that shapes a spectral response of the photodetector, comprising:

(a) forming a plurality of metal layers over a plurality of photodiode regions, wherein the plurality of metal layers include a lowermost metal layer that is closest to the photodiode regions and an uppermost metal layer that is farthest from the photodiode regions, and wherein each of the metal layers includes one or more metal portions and one or more dielectric portions; and (b) forming an optical filter over at least a portion of the uppermost metal layer such that the optical filter, after it if formed, *has a continuous area that* covers [one] *two* or more of the photodiode regions *that are adjacent to one another*;

wherein step (a) is performed such that the uppermost metal layer is devoid of any metal portions that will underlie the optical filter after the optical filter is formed at step (b).

13. The method of claim 12, wherein step (a) comprises forming the plurality of metal layers such that one or more of the metal portions of one or more of the metal layers, other than the uppermost metal layer, block light from reaching one or more of the photodiode regions.

14. The method of claim 12, wherein step (b) comprises forming the optical filter such that an outer periphery of the optical filter includes obtuse angles and is devoid any angles that are equal to or less than 90 degrees.

15. The method of claim 12, wherein the forming the optical filter at step (b) comprises depositing a dielectric reflective optical coating filter that is configured to reject infrared (IR) light and then patterning the dielectric reflective optical coating filter.

16. The method of claim 12, wherein the forming the optical filter at step (b) comprises depositing a dielectric reflective optical coating using an evaporative deposition process and then patterning the dielectric reflective optical coating filter.

17. A system *that is responsive to ambient visible light*, comprising:

a photodetector configured to produce a current indicative of ambient visible light; and a subsystem that is adjusted in dependence on the current produced by the photodetector;

wherein the photodetector includes a plurality of photodiode regions;

an optical filter [covering one] *having a continuous area that covers two* or more of the photodiode regions *that are adjacent to one another*;

a plurality of metal layers located between the photodiode regions and the optical filter, wherein the plurality of metal layers include an uppermost metal layer that is closest to the optical filter and a lowermost metal layer that is closest to the photodiode regions; and one or more inter-level dielectric layers that separate the metal layers from one another;

wherein each of the metal layers includes one or more metal portions and one or more dielectric portions; and wherein the uppermost metal layer is devoid of any metal portions underlying the optical filter.

18. The system of claim 17, further comprising:

at least one of a processor or comparator configured to compare the current indicative of ambient visible light, or a voltage produced therefrom, to one or more threshold, to determine whether to enable, disable or adjust a brightness of the subsystem.

19. The system of claim 17, wherein:

the plurality of photodiode regions of the photodetector include one or more first photodiode regions that are covered by the optical filter, and one *or* more second photodiode regions that are covered by a light blocking material; and the light blocking material of the photodetector comprises metal portions of one or more of the metal layers other than the uppermost metal layer.

20. The system of claim 17, wherein an outer periphery of the optical filter of the photodetector include obtuse angles and is devoid any angles that are equal to or less than 90 degrees.

*21. A photodetector, comprising:*

*a plurality of photodiode regions;*

*a plurality of metal layers located between the photodiode regions and a surface area on which an optical filter is to be formed to have a continuous area that covers a group of two or more of the photodiode regions that are adjacent to one another,*

*wherein the plurality of metal layers include an uppermost metal layer that is closest to the surface area on which the optical filter is to be formed and a lowermost metal layer that is closest to the photodiode regions; and*

*one or more inter-level dielectric layers that separate the metal layers from one another;*

*wherein each of the metal layers includes one or more metal portions and one or more dielectric portions; and*

*wherein the uppermost metal layer is devoid of any metal portions underlying the surface area on which the optical filter is to be formed.*

*22. The photodetector of claim 21, wherein one or more of the photodiode regions are not covered by the surface area on which the optical filter is to be formed.*

*23. The photodetector of claim 21, wherein a portion of the uppermost metal layer, which is devoid of any metal portions, consists of a dielectric portion of the uppermost metal layer.*

*24. The photodetector of claim 21, wherein a distance between a periphery of the surface area on which the optical filter is to be formed and a closest metal portion of the uppermost metal layer is at least 20 microns.*

*25. The photodetector of claim 21, wherein:*

*the group of two or more of the photodiode regions that are adjacent to one another includes one or more first photodiode regions that are covered by a light blocking material, and one more second photodiode regions that are not covered by a light blocking material; and*

*the light blocking material comprises one or more metal portions of one or more of the metal layers other than the uppermost metal layer.*

*26. The photodetector of claim 25, wherein:*

*the plurality of metal layers, located between the photodiode regions and the surface area on which the optical filter is to be formed, comprise at least four metal layers;*

*the light blocking material comprises one or more metal portions of the at least one of the two metal layers that are closest to the photodiode regions; and*

*the two metal layers, that are closest to surface area on which the optical filter is to be formed, are each devoid of any metal portions underlying the surface area on which the optical filter is to be formed.*

*27. A photodetector, comprising:*

*a plurality of photodiode regions;*

*a plurality of metal layers located above the photodiode regions, wherein the plurality of metal layers include an uppermost metal layer that is farthest from the photodiode regions and a lowermost metal layer that is closest to the photodiode regions; and*

*one or more inter-level dielectric layers that separate the metal layers from one another;*

*wherein each of the metal layers includes one or more metal portions and one or more dielectric portions; and*

*wherein a continuous area of the uppermost metal layer, that covers a group of two or more of the photodiode regions that are adjacent to one another, is devoid of any metal portions.*

*28. The photodetector of claim 27, wherein the continuous area of the uppermost metal layer, that is devoid of any metal portions and that covers the group of two or more of the photodiode regions that are adjacent to one another, consists of a dielectric portion of the uppermost metal layer.*

*29. The photodetector of claim 27, wherein:*

*the group of two or more of the photodiode regions that are adjacent to one another includes one or more first photodiode regions that are not covered by a light blocking material, and one or more second photodiode regions that are covered by a light blocking material; and*

*the light blocking material comprises one or more metal portions of one or more of the metal layers other than the uppermost metal layer.*

*30. The photodetector of claim 29, wherein:*

*the plurality of metal layers comprise at least four metal layers;*

*the light blocking material comprises one or more metal portions of at least one of the two metal layers that are closest to the photodiode regions; and*

*the two metal layers, that are farthest from the photodiode regions, are each devoid of any metal portions below the continuous area of the uppermost metal layer that covers the group of two or more of the photodiode regions that are adjacent to one another.*

* * * * *